(12) United States Patent
Dodson et al.

(10) Patent No.: US 10,297,335 B2
(45) Date of Patent: May 21, 2019

(54) TRACKING ADDRESS RANGES FOR COMPUTER MEMORY ERRORS

(71) Applicant: International Business Machines Corporation, Armonk, NY (US)

(72) Inventors: John S. Dodson, Austin, TX (US); Marc A. Gollub, Round Rock, TX (US); Warren E. Maule, Cedar Park, TX (US); Brad W. Michael, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 15/255,324

(22) Filed: Sep. 2, 2016

(65) Prior Publication Data

US 2018/0068741 A1 Mar. 8, 2018

(51) Int. Cl.
*G06F 11/00* (2006.01)
*G11C 29/44* (2006.01)
*G11C 29/38* (2006.01)

(52) U.S. Cl.
CPC .............. *G11C 29/44* (2013.01); *G11C 29/38* (2013.01); *G11C 2029/4402* (2013.01)

(58) Field of Classification Search
CPC ......... G11C 29/10; G11C 29/38; G11C 29/44; G11C 29/4401; G11C 2029/4402
See application file for complete search history.

(56) References Cited

U.S. PATENT DOCUMENTS

| | | | |
|---|---|---|---|
| 4,209,809 A | 6/1980 | Chang et al. |
| 4,506,362 A | 3/1985 | Morley |
| 4,577,240 A | 3/1986 | Hedberg et al. |
| 4,939,694 A | 7/1990 | Eaton et al. |
| 4,964,129 A | 10/1990 | Bowden, III et al. |
| 4,964,130 A | 10/1990 | Bowden, III et al. |
| 5,014,273 A | 5/1991 | Gagliardo et al. |
| 5,390,309 A | 2/1995 | Onodera |
| 5,644,539 A | 7/1997 | Yamagami et al. |
| 5,872,905 A | 2/1999 | Ono et al. |
| 8,352,806 B2 | 1/2013 | Gollub et al. |
| 8,484,529 B2 | 7/2013 | Alves et al. |
| 8,650,437 B2 | 2/2014 | Fry et al. |

(Continued)

OTHER PUBLICATIONS

Appendix P; List of IBM Patent or Applications Treated as Related, Dec. 2, 2016, 2 pages.

*Primary Examiner* — Michael Maskulinski
(74) *Attorney, Agent, or Firm* — Nathan M. Rau

(57) ABSTRACT

Tracking address ranges for computer memory errors including detecting, by memory logic, an error at a memory address, the memory address representing one or more memory cells at a physical location of computer memory; reporting, by the memory logic to memory firmware, the detected error including providing the memory firmware with the memory address; identifying, by the memory firmware, an address range affected by the detected error including scanning the computer memory in dependence upon the memory address; determining, by the memory firmware, a region size based on the address range affected by the detected error; and populating an entry in a mark table corresponding to the detected error, including populating a field specifying the region size and a field specifying a match address corresponding to the memory address.

17 Claims, 5 Drawing Sheets

(56) References Cited

U.S. PATENT DOCUMENTS

| | | |
|---|---|---|
| 8,689,080 B2 | 4/2014 | Carman et al. |
| 8,862,953 B2 | 10/2014 | Gollub et al. |
| 9,092,361 B2 | 7/2015 | Honda et al. |
| 9,244,852 B2 | 1/2016 | Prasad |
| 2002/0191319 A1 | 12/2002 | Liew et al. |
| 2003/0088805 A1 | 5/2003 | Majni et al. |
| 2004/0078700 A1 | 4/2004 | Jeong |
| 2006/0007801 A1 | 1/2006 | Takashima |
| 2008/0072118 A1 | 3/2008 | Brown et al. |
| 2009/0164727 A1 | 6/2009 | Penton et al. |
| 2009/0300425 A1* | 12/2009 | Gollub ............... G06F 11/0715 714/42 |
| 2009/0313526 A1 | 12/2009 | Neuman |
| 2010/0037044 A1 | 2/2010 | Yang et al. |
| 2010/0287445 A1 | 11/2010 | Dell et al. |
| 2010/0293437 A1 | 11/2010 | Gollub et al. |
| 2011/0320911 A1* | 12/2011 | Fry ................... G06F 11/1048 714/758 |
| 2011/0320914 A1 | 12/2011 | Alves et al. |
| 2012/0173936 A1 | 7/2012 | Johnson et al. |
| 2013/0007542 A1 | 1/2013 | Carman et al. |
| 2013/0326293 A1* | 12/2013 | Muralimanohar ..... G11C 29/08 714/718 |
| 2014/0026011 A1 | 1/2014 | Huang et al. |
| 2014/0195867 A1 | 7/2014 | Gollub et al. |
| 2014/0223239 A1 | 8/2014 | Mittal et al. |
| 2015/0089280 A1* | 3/2015 | Sade ................... G06F 11/073 714/6.12 |
| 2016/0132259 A1 | 5/2016 | Dell et al. |
| 2016/0239228 A1 | 8/2016 | Bennett |
| 2018/0067719 A1 | 3/2018 | Dodson et al. |
| 2018/0067798 A1 | 3/2018 | Dodson et al. |
| 2018/0067806 A1 | 3/2018 | Dodson et al. |

\* cited by examiner

TRACKING ADDRESS RANGES FOR COMPUTER MEMORY ERRORS

BACKGROUND

Field of the Invention

The field of the invention is data processing, or, more specifically, methods, apparatus, and products for tracking address ranges for computer memory errors.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for tracking address ranges for computer memory errors are disclosed in this specification. Tracking address ranges for computer memory errors includes detecting, by memory logic, an error at a memory address, the memory address representing one or more memory cells at a physical location of computer memory; reporting, by the memory logic to memory firmware, the detected error including providing the memory firmware with the memory address; identifying, by the memory firmware, an address range affected by the detected error including scanning the computer memory in dependence upon the memory address; determining, by the memory firmware, a region size based on the address range affected by the detected error; and populating an entry in a mark table corresponding to the detected error, including populating a field specifying the region size and a field specifying a match address corresponding to the memory address.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
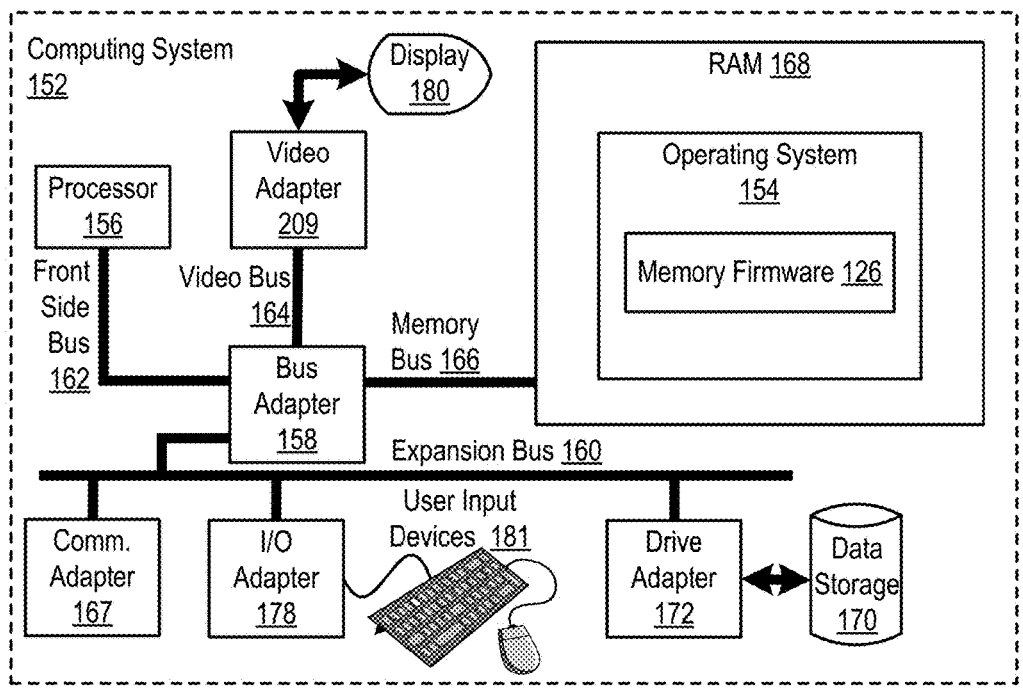
FIG. 1 sets forth a block diagram of an example system configured for tracking address ranges for computer memory errors according to embodiments of the present invention.

Exemplary methods, apparatus, and products for tracking address ranges for computer memory errors in accordance with the present invention are described with reference to the accompanying drawings, beginning with FIG. 1. FIG. 1 sets forth a block diagram of automated computing machinery comprising an exemplary computing system (152) configured for tracking address ranges for computer memory errors according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for tracking address ranges for computer memory errors according to embodiments of the present invention include UNIX™, Linux™, Microsoft XP™, AIX™, IBM's i5/OS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) and part of the operating system is the memory firmware (126), a module of computer program instructions for tracking address ranges for computer memory errors.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of disk drive (170). Disk drive adapters useful in computers configured for tracking address ranges for computer memory errors according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers (182) and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for tracking address ranges for computer memory errors according to embodiments of the present invention include modems for wired dial-up communications, Ethernet (IEEE 802.3) adapters for wired data communications, and 802.11 adapters for wireless data communications.

Figure 2:
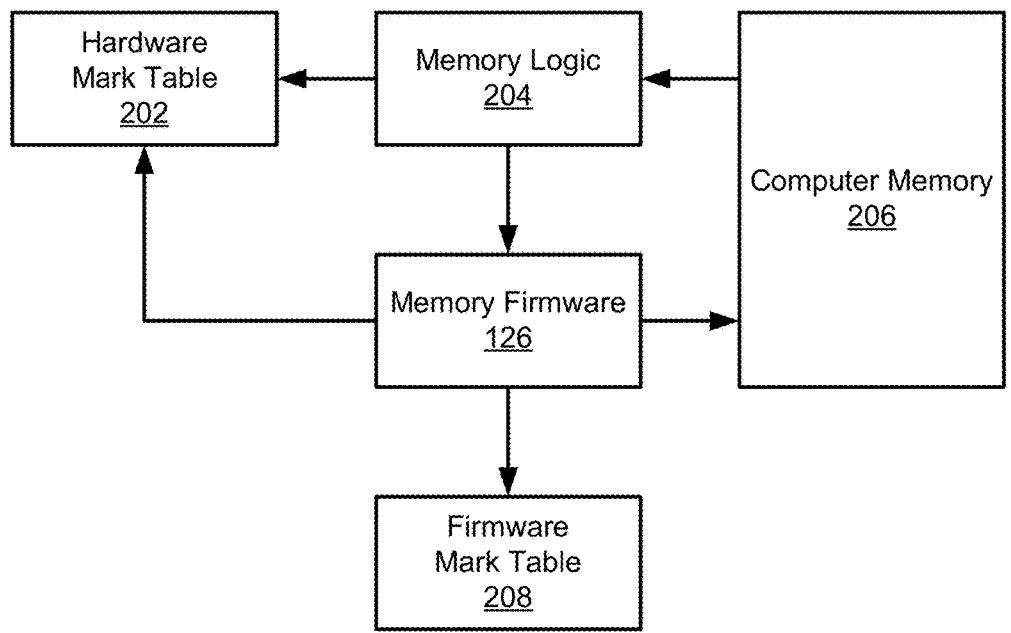
FIG. 2 sets forth a block diagram for tracking address ranges for computer memory errors according to embodiments of the present invention.

FIG. 2 is an example block diagram of a system configured for tracking address ranges for computer memory errors. FIG. 2 includes a hardware mark table (202), memory logic (204), computer memory (206) (such as RAM (168)), memory firmware (126), and a firmware mark table (208).

The error correction code (ECC) system uses two types of marks that correspond to different sets of bit error locations. Symbol marks indicate errors expected in one or more bits associated with a particular DRAM data bit. Such errors may be caused, for example, by a faulty DRAM data I/O pin or by a DRAM internal failure which affects only bits within the set. Chip marks indicate errors expected in one or more bits associated with a particular DRAM chip. Such errors may be caused, for example, by multiple faulty DRAM data I/O pins, a faulty dram address or control I/O pin, or a DRAM internal failure which affects a larger portion of data than would be covered by a symbol mark. A chip mark is equivalent to a set of symbol marks covering all data from one DRAM chip.

The hardware mark table (202) is a data structure architected in hardware with fields that may be altered. The hardware mark table (202) may be a part of the computer memory (206) hardware, the CPU hardware, or another hardware structure within the computing system. The hardware mark table (202) is configured to store information about detected errors within the computer memory (206). Specifically, the hardware mark table (202) may store a chip mark for a single region (e.g., a rank) within the computer memory (206).

The hardware mark table (202) may be limited to storing a single type of error (e.g., a chip mark). Further, the hardware mark table (202) may also be limited to indicating an error in a single region level. For example, the hardware mark table (202) may store a chip mark for one or more ranks in the computer memory (206). The hardware mark table (202) may be unable to store a second error indication (e.g., a symbol mark) or indicate that the error applies to a broader or narrower set of elements within the computer memory (206) (e.g., a dual in-line memory module (DIMM), a group of banks, or a bank).

The memory logic (204) is a collection of programs within hardware, software, or firmware that detects errors within the computer memory (206) and reports those errors using the hardware mark table (202). The memory logic (204) may be limited in the types and applicability of the errors the memory logic (204) is able to report. For example, the memory logic (204) may only be able to detect one type of error in one region (e.g., at least one unreliable 4 bit word within a rank).

The computer memory (206) is a group of bit storage devices used to store data for a computing system. The computer memory (206) may include a hierarchy of components. For example, each bit storage device may be a capacitor, and the capacitors may be grouped in banks. The banks may be grouped in bank groups, a set of bank groups may be organized into a set of ranks, and a set of ranks may be organized into a DIMM.

The memory firmware (126) is a collection of programs within the computing system used to facilitate interoperability between the software components on the computing system and the memory hardware. The memory firmware (126) may be part of an operating system or hypervisor executing on the computing system. The memory firmware (126) may further include functionality to initiate a scan of the computer memory using, for example, a scrub engine that scans a region of the computer memory (206) to obtain information about the error, such as the type of error and the range of memory addresses affected by the error. The memory firmware (126) may then store the information in the firmware mark table (208).

The firmware mark table (208) is a mark table used by the memory firmware (126) to store information about detected errors in the computer memory (206). The firmware mark table (208) may store more information about detected errors then may be stored in the hardware mark table (202). Each entry in the firmware mark table (208) may include a match address, a region size, and a mark location for each error detected by the memory firmware (126). Although FIG. 2 shows the hardware mark table (202) and the firmware mark table (208) as separately implemented tables, the hardware mark table (202) and the firmware mark table (208) may be implemented as a single table (e.g., a single firmware mark table).

The firmware mark table (208) may be stored in content-addressable memory (CAM) such that the contents may be retrieved using a CAM lookup. The firmware mark table (208) may be configured such that entries may be retrieved by matching a memory address to a match address of an entry in the firmware mark table (208). A matching entry may also incorporate the region size to determine a match. Specifically, a match may be a hit if the given memory address is within the same specified region as the match address.

Figure 3:
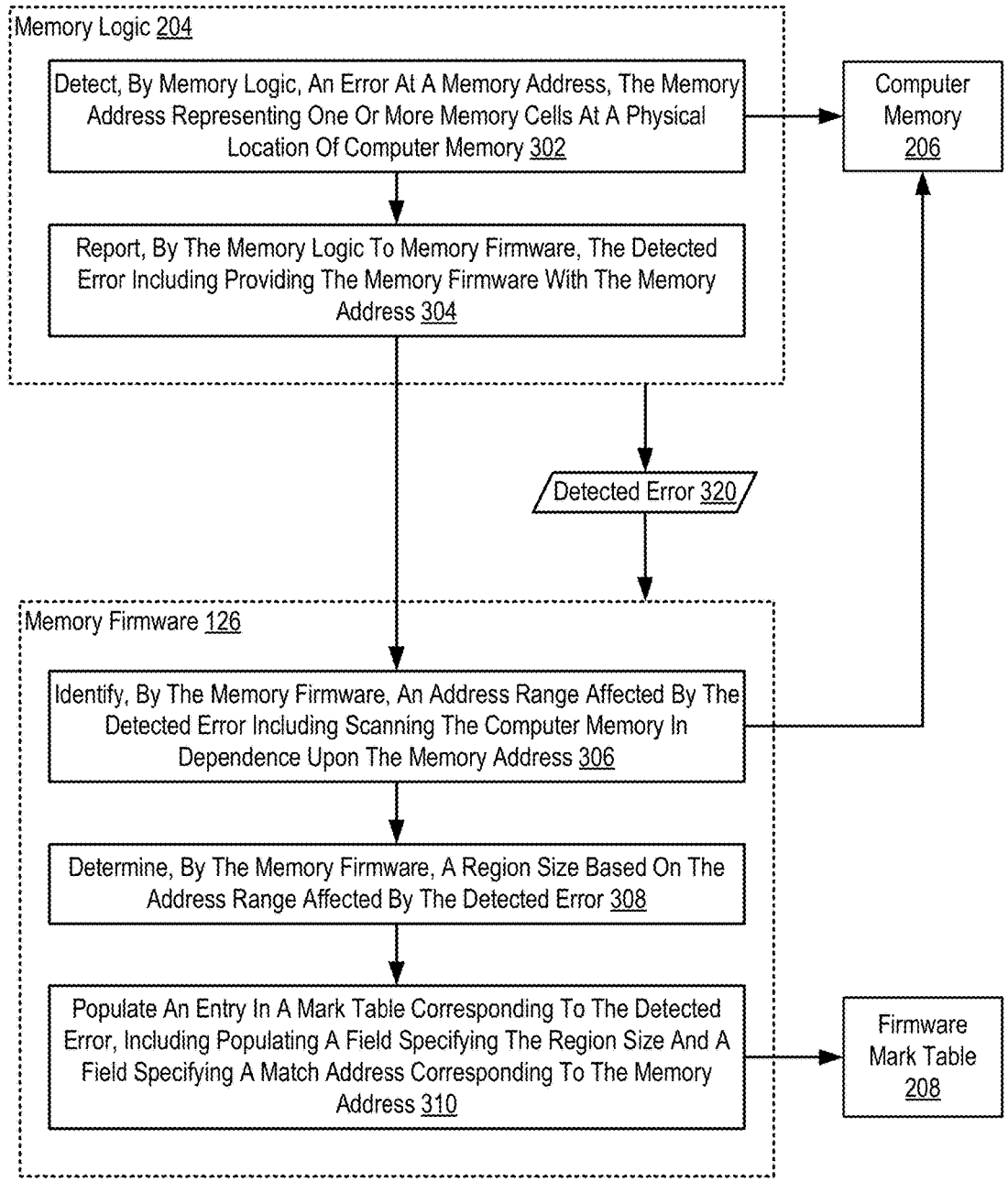
FIG. 3 sets forth a flow chart illustrating an exemplary method for tracking address ranges for computer memory errors according to embodiments of the present invention.

For further explanation, FIG. 3 sets forth a flow chart illustrating an exemplary method for tracking address ranges for computer memory errors according to embodiments of the present invention. The method of FIG. 3 includes detecting (302), by memory logic (204), an error at a memory address, the memory address representing one or more memory cells at a physical location of computer memory (206). Detecting (302), by memory logic (204), an error at a memory address, the memory address representing one or more memory cells at a physical location of computer memory (206) may be carried out by receiving, by the memory logic (204), an indication that a read performed at the memory address was unsuccessful and/or returned a failure. The error may be detected based on a comparison between data read from the memory and the check bits read from the memory address. If the calculated check bit does not match the check bit read from the memory address, the memory logic may determine that an error exists at the memory address.

The error recorded by the memory logic (204) in the hardware mark table (202) may be non-specific with regard to the memory address and region. The detected error may be associated with the memory address of a rank, and the memory address of the unreliable bit causing the error may not be stored the memory logic (204).

The method of FIG. 3 also includes reporting (304), by the memory logic (204) to memory firmware (126), the detected error (320) including providing the memory firmware (126) with the memory address. Reporting (304), by the memory logic (204) to memory firmware (126), the detected error (320) including providing the memory firmware (126) with the memory address may be carried out by storing, in a hardware mark table, the region of the error (e.g., the rank) and a chip mark indicating the existence of the error. The hardware mark table may be monitored by the memory firmware (126) and the addition of a new entry in the hardware mark table may notify the memory firmware (126) of the error.

Reporting (304), by the memory logic (204) to memory firmware (126), the detected error (320) including providing the memory firmware (126) with the memory address may be carried out by sending, from the memory logic (204) a message to the memory firmware (126) informing the memory firmware (126) of the existence of the error and the memory address of the rank at which the error was detected.

The method of FIG. 3 also includes identifying (306), by the memory firmware (126), an address range affected by the detected error (320) including scanning the computer memory (206) in dependence upon the memory address. Identifying (306), by the memory firmware (126), an address range affected by the detected error (320) including scanning the computer memory (206) in dependence upon the memory address may be carried out by testing the memory locations at and near the memory address. The memory address may identify a region (e.g., a rank) within which the error was detected. The memory firmware (126) may test the other bits within the region (e.g., rank) identified by the memory address to determine the specific bits and memory addresses affected by the error. The memory firmware (126) may also test bits near or adjacent to the region to determine whether other memory addresses within other regions are also affected.

Identifying (306), by the memory firmware (126), an address range affected by the detected error (320) including scanning the computer memory (206) in dependence upon the memory address may be carried out by instructing a scrub engine to scan a region encompassing the memory address. A scrub engine may be logic within the computing system that continuously crawls the computer memory to determine the existence of errors. The memory firmware (126) may instruct the scrub engine to target a specific memory address or region to determine the existence of unreliable bits or other errors at the memory address or within the region.

For example, the memory logic (204) may report to the memory firmware (126) that the rank at memory address '42' includes an error. The memory firmware (126) may then instruct a scrub engine to analyze each memory address within the rank at memory address '34' to determine which exact memory address or memory addresses are unreliable or cause errors. The scrub engine may then inform the memory firmware (126) that two banks (with an address range of '40'-'44') within the rank include one or more error-causing bits.

Identifying (306), by the memory firmware (126), an address range affected by the detected error (320) may also include identifying a type of error that exists within the address range. The identified error type may be correctable errors, uncorrectable errors, single-bit errors, 4-bit word errors, etc.

The method of FIG. 3 also includes determining (308), by the memory firmware (126), a region size based on the address range affected by the detected error (320). Determining (308), by the memory firmware (126), a region size based on the address range affected by the detected error (320) may be carried out by determining which elements within the computer memory are encompassed by the address range. The address range received by the memory firmware may include a list of addresses of error-causing bits. The address range may be contiguous or non-contiguous, or may include both contiguous address ranges and other non-contiguous addresses.

For example, the memory firmware (126) may be notified that errors exist at addresses '40' and '42' within bank A, addresses '48-50' within bank B. The memory firmware may determine that the region size affected by the detected error is bank A and bank B. If bank A and bank B are both within the same bank group, then the memory firmware may determine that the region size affected by the detected error is the entire bank group.

The region size may be determined based on a region sizing policy. The region size policy may inform the memory firmware (126) the point at which one region is determined to be affected by a detected error. The region size policy may include thresholds or patterns of detected errors which, if satisfied, cause the memory firmware (126) to determine a region size of the detected error. For example, one region size policy may state that a bank group is the region size of a detected error if errors are detected in each bank within the bank group and a total of at least 8 errors are detected within the bank group. If the memory firmware (126) determines that the policy is not satisfied, then a smaller region size may be determined based on the address range.

The method of FIG. 3 also includes populating (310) an entry in a mark table (208) corresponding to the detected error (320), including populating a field specifying the region size and a field specifying a match address corresponding to the memory address. Populating (310) an entry in a mark table (208) corresponding to the detected error (320), including populating a field specifying the region size and a field specifying a match address corresponding to the memory address may be carried out by adding the entry to the mark table (208) keyed to the match address. The match address may be set as the memory address of the detected error. Alternatively, the match address may be calculated based on the element or elements affected by the detected error.

The mark table (208) may be a firmware mark table stored in content-addressable memory. Entries within the mark table (208) may be retrieved by matching a search address to the match address, or by matching a search address to any address within a region encompassing the match address.

The field specifying the region size may include a code identifying the region level required for a match to the match address. For example, '111' may indicate that a match is a hit if the search address is within the same whole memory port as the match address, '110' may indicate that a match is a hit if the search address is within the same DIMM as the match address, '101' may indicate that a match is a hit if the search address is within the same DIMM and same master rank as the match address, '100' may indicate that a match is a hit if the search address is within the same DIMM, same master rank, and same slave rank as the match address, '011' may indicate that a match is a hit if the search address is within the same DIMM, same master rank, same slave rank, and same bank group as the match address, and '010' may indicate that a match is a hit if the search address is within the same DIMM, same master rank, same slave rank, same bank group, and same bank as the match address.

Once the mark table (208) is populated, memory read requests received by the memory firmware may trigger a lookup into the mark table to determine if the request is attempting to read from a location within memory that has reported errors. If an entry is found to match the address of the read request, the memory firmware may attempt to provide the data using error correcting code or return an indication that the read request has failed.

Figure 4:
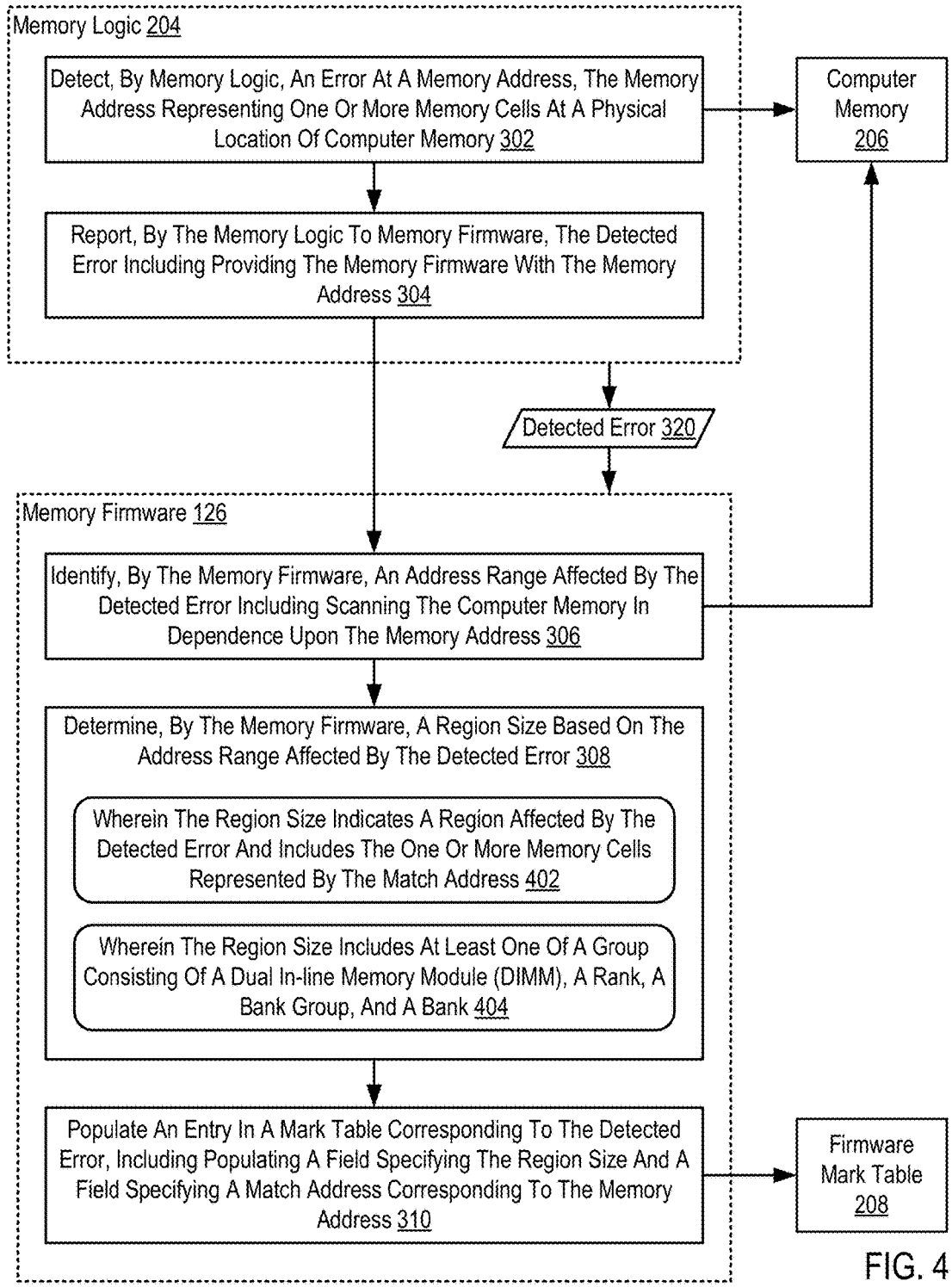
FIG. 4 sets forth a flow chart illustrating an exemplary method for tracking address ranges for computer memory errors according to embodiments of the present invention.

For further explanation, FIG. 4 sets forth a flow chart illustrating an exemplary method for tracking address ranges for computer memory errors according to embodiments of the present invention that includes detecting (302), by memory logic (204), an error at a memory address, the memory address representing one or more memory cells at a physical location of computer memory (206); reporting (304), by the memory logic (204) to memory firmware (126), the detected error (320) including providing the memory firmware (126) with the memory address; identifying (306), by the memory firmware (126), an address range affected by the detected error (320) including scanning the computer memory (206) in dependence upon the memory address; determining (308), by the memory firmware (126), a region size based on the address range affected by the detected error (320); and populating (310) an entry in a mark table (208) corresponding to the detected error (320), including populating a field specifying the region size and a field specifying a match address corresponding to the memory address.

The method of FIG. 4 differs from the method of FIG. 3, however, in that the method of FIG. 4 further includes wherein (402) the region size indicates a region affected by the detected error (320) and includes the one or more memory cells represented by the match address. The region size may indicate the element or elements identified by the match address and affected by the detected error or errors. The region may include the memory cells that are unreliable and/or cause errors and other affected memory cells.

The method of FIG. 4 also includes wherein (404) the region size includes at least one of a group consisting of a dual in-line memory module (DIMM), a rank, a bank group, and a bank. Within the mark table, the region size may be indicated using codes, as discussed above.

Figure 5:
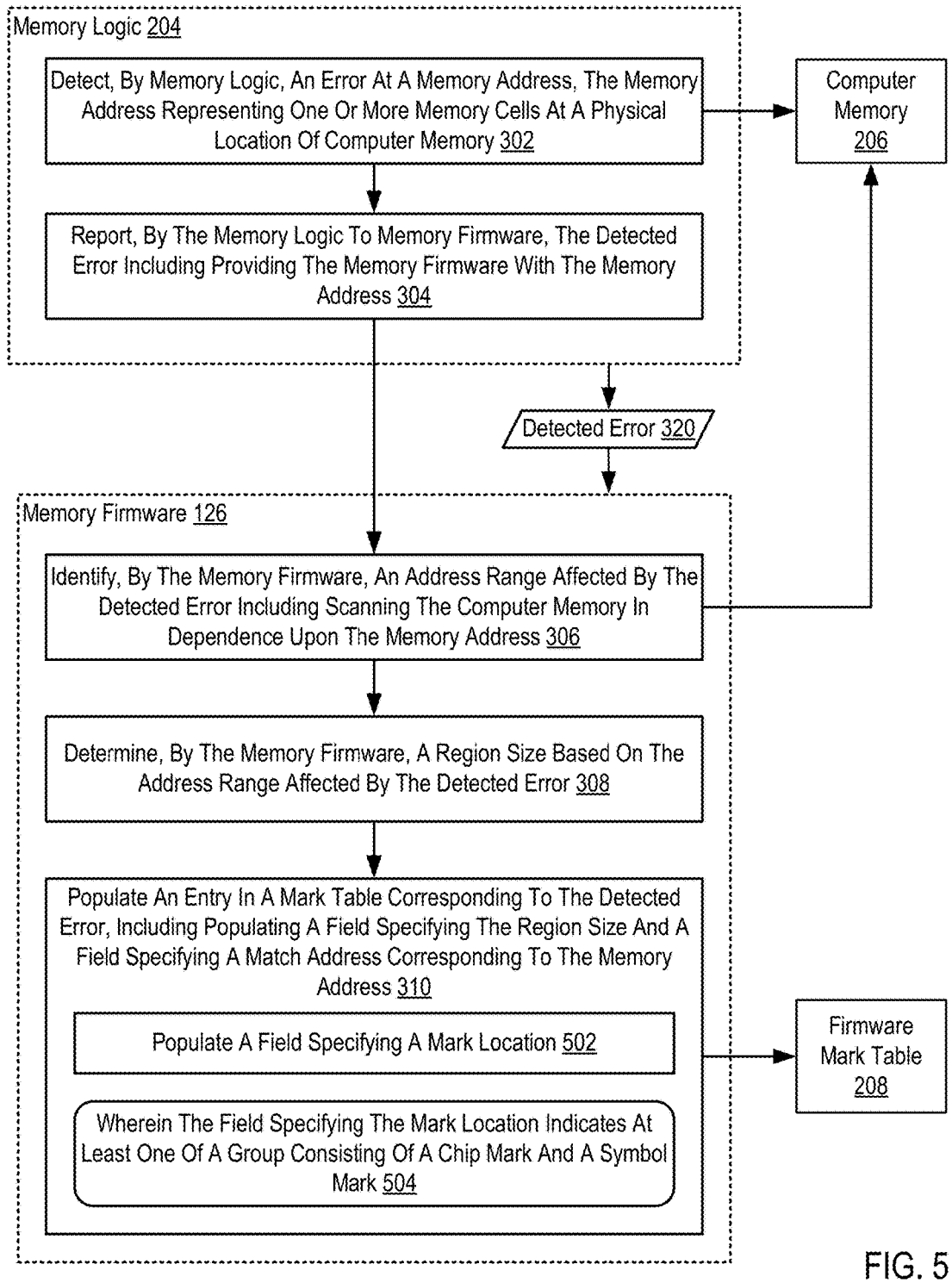
FIG. 5 sets forth a flow chart illustrating an exemplary method for tracking address ranges for computer memory errors according to embodiments of the present invention.

For further explanation, FIG. 5 sets forth a flow chart illustrating an exemplary method for tracking address ranges for computer memory errors according to embodiments of the present invention that includes detecting (302), by memory logic (204), an error at a memory address, the memory address representing one or more memory cells at a physical location of computer memory (206); reporting (304), by the memory logic (204) to memory firmware (126), the detected error (320) including providing the memory firmware (126) with the memory address; identifying (306), by the memory firmware (126), an address range affected by the detected error (320) including scanning the computer memory (206) in dependence upon the memory address; determining (308), by the memory firmware (126), a region size based on the address range affected by the detected error (320); and populating (310) an entry in a mark table (208) corresponding to the detected error (320), including populating a field specifying the region size and a field specifying a match address corresponding to the memory address.

The method of FIG. 5 differs from the method of FIG. 3, however, in that the method of FIG. 5 further includes populating (502) a field specifying a mark location, wherein (504) the field specifying the mark location indicates at least one of a group consisting of a chip mark and a symbol mark. Populating (502) a field specifying a mark location may be carried out by writing, to an entry in the mark table, an indication of the detected error and type of error detected. The mark location may include a chip mark and/or a symbol mark. A chip mark may indicate that the error is within a range of bits, such as within a 4-bit word. A symbol mark may indicate that the error is at a specific bit within the region.

In view of the explanations set forth above, readers will recognize that the benefits of tracking address ranges for computer memory errors according to embodiments of the present invention include:

Improving the operation of a computer system by tracking more information about memory errors to increase memory reliability and predictability.

Improving the operation of a computer system by tracking errors within a narrow region of computer memory to increase memory reliability and predictability.

Improving the operation of a computer system by tracking multiple errors within the same region of computer memory to increase memory reliability and predictability.

Exemplary embodiments of the present invention are described largely in the context of a fully functional computer system for tracking address ranges for computer memory errors. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of tracking address ranges for computer memory errors, the method comprising:
   detecting, by memory logic, an error at a memory address, the memory address representing one or more memory cells at a physical location of computer memory;
   reporting, by the memory logic to memory firmware, the detected error including providing the memory firmware with the memory address;
   identifying, by the memory firmware, an address range affected by the detected error including scanning the computer memory in dependence upon the memory address;

determining, by the memory firmware, a region size based on the address range affected by the detected error; and populating an entry in a mark table corresponding to the detected error, including populating a field specifying the region size, a field specifying a match address corresponding to the memory address, and populating a field specifying a mark location.

2. The method of claim 1, wherein the region size indicates a region affected by the detected error and includes the one or more memory cells represented by the match address.

3. The method of claim 2, wherein the region size includes at least one of a group consisting of a dual in-line memory module (DIMM), a rank, a bank group, and a bank.

4. The method of claim 1, wherein the field specifying the mark location indicates at least one of a group consisting of a chip mark and a symbol mark.

5. The method of claim 1, wherein the mark table is a firmware mark table stored in content-addressable memory.

6. The method of claim 1, wherein identifying, by the memory firmware, the address range affected by the detected error comprises instructing a scrub engine to scan a region encompassing the memory address.

7. An apparatus for tracking address ranges for computer memory errors, the apparatus configured to carry out the steps of:

detecting, by memory logic, an error at a memory address, the memory address representing one or more memory cells at a physical location of computer memory;

reporting, by the memory logic to memory firmware, the detected error including providing the memory firmware with the memory address;

identifying, by the memory firmware, an address range affected by the detected error including scanning the computer memory in dependence upon the memory address;

determining, by the memory firmware, a region size based on the address range affected by the detected error; and populating an entry in a mark table corresponding to the detected error, including populating a field specifying the region size, a field specifying a match address corresponding to the memory address, and populating a field specifying a mark location.

8. The apparatus of claim 7, wherein the region size indicates a region affected by the detected error and includes the one or more memory cells represented by the match address.

9. The apparatus of claim 8, wherein the region size includes at least one of a group consisting of a dual in-line memory module (DIMM), a rank, a bank group, and a bank.

10. The apparatus of claim 7, wherein the field specifying the mark location indicates at least one of a group consisting of a chip mark and a symbol mark.

11. The apparatus of claim 7, wherein the mark table is a firmware mark table stored in content-addressable memory.

12. The apparatus of claim 7, wherein identifying, by the memory firmware, the address range affected by the detected error comprises instructing a scrub engine to scan a region encompassing the memory address.

13. A computer program product for tracking address ranges for computer memory errors, the computer program product disposed upon a non-transitory computer readable medium, the computer program product configured to carry out the steps of:

detecting, by memory logic, an error at a memory address, the memory address representing one or more memory cells at a physical location of computer memory;

reporting, by the memory logic to memory firmware, the detected error including providing the memory firmware with the memory address;

identifying, by the memory firmware, an address range affected by the detected error including scanning the computer memory in dependence upon the memory address;

determining, by the memory firmware, a region size based on the address range affected by the detected error; and populating an entry in a mark table corresponding to the detected error, including populating a field specifying the region size, a field specifying a match address corresponding to the memory address, and populating a field specifying a mark location.

14. The computer program product of claim 13, wherein the region size indicates a region affected by the detected error and includes the one or more memory cells represented by the match address.

15. The computer program product of claim 14, wherein the region size includes at least one of a group consisting of a dual in-line memory module (DIMM), a rank, a bank group, and a bank.

16. The computer program product of claim 13, wherein the field specifying the mark location indicates at least one of a group consisting of a chip mark and a symbol mark.

17. The computer program product of claim 13, wherein the mark table is a firmware mark table stored in content-addressable memory.

* * * * *